(12) United States Patent
Pathak

(10) Patent No.: US 6,487,139 B1
(45) Date of Patent: Nov. 26, 2002

(54) MEMORY ROW LINE DRIVER CIRCUIT

(76) Inventor: Jagdish Pathak, 12998 Robleda Rd., Los Altos Hills, CA (US) 94022

(*) Notice: Subject to any disclaimer, the term of this patent is extended or adjusted under 35 U.S.C. 154(b) by 0 days.

(21) Appl. No.: 09/967,322

(22) Filed: Sep. 28, 2001

(51) Int. Cl.[7] ............................................. G11C 8/00
(52) U.S. Cl. ............................ 365/230.06; 365/185.23
(58) Field of Search ..................... 365/230.06, 185.23, 365/175

(56) References Cited

U.S. PATENT DOCUMENTS

| | | | | |
|---|---|---|---|---|
| 5,208,773 A | * | 5/1993 | Okitaka et al. | 365/189.04 |
| 5,233,206 A | * | 8/1993 | Lee et al. | 257/50 |
| 5,490,105 A | * | 2/1996 | Chandna et al. | 365/156 |
| 5,497,345 A | * | 3/1996 | Cappelletti | 257/551 |

* cited by examiner

*Primary Examiner*—Huan Hoang
(74) *Attorney, Agent, or Firm*—Sierra Patent Group, Ltd.

(57) ABSTRACT

A line driver circuit is disclosed which may comprise a first supply voltage potential node; a second supply voltage potential node; a latch node; a first transistor of a first conductivity type and having a source coupled to the first supply voltage potential node, a drain coupled to the latch node, and a gate; a second transistor of the first conductivity type and having a source coupled to the first supply voltage potential node, a drain coupled to the gate of the first transistor of the first conductivity type, and a gate coupled to the latch node; a first transistor of a second conductivity type opposite to the first conductivity type and having a drain coupled to the drain of the second transistor of the first conductivity type, a source coupled to the second supply voltage potential node and a gate coupled to the latch node; and a diode having an anode coupled to the input node and a cathode coupled to the second supply voltage potential node.

14 Claims, 5 Drawing Sheets

MEMORY ROW LINE DRIVER CIRCUIT

BACKGROUND OF THE INVENTION

1. Field of the Invention

The present disclosure relates to circuitry for writing data into nonvolatile memories, and in particular to providing high voltage pulses with variable base voltage levels.

2. The Prior Art

In typical floating gate nonvolatile memories, it is necessary to apply much higher voltages to the array when writing data into the memory than when reading data from the memory. This frequently requires that the transistors used to route the bias voltages employed to write to the memory be different than those used for reading operations. Generally, it is desirable not to consume static power in the circuits used to route the write bias voltages to reduce the write power consumption and, more importantly, to avoid excessive current draw from on chip charge pumps used to generate the high write voltages.

The prior art has labored to design suitable circuits to write nonvolatile memories. Typically, early efforts employed either charge pumps or boot-strap circuits in order to supply write biases using only n-channel transistors. With the development of technologies that would support high voltage, complimentary MOSFETs, the design problem was somewhat simplified and many products were designed using the "half-latch" circuit shown in FIG. 1, and disclosed in William Ip, et al, "256 kb CMOS EPROM", ISSCC Digest of Technical Papers, pp. 138–9 (1984), and Sanjay Mehrotra et al, "A 64 kb CMOS EEPROM with On-Chip ECC", ISSCC Digest of Technical Papers, pp. 142–3 (1984).

As manufacturing technology for integrated circuits has been scaled to finer feature sizes, the size of memory cells has been reduced, allowing more bits to be stored in a given area. However, the voltage handling capability of the transistors has also decreased. Unfortunately, the magnitude of the voltages required to write data into nonvolatile memories has not decreased as fast as the voltage handling capability of the scaled transistors.

In order to reduce the stress on the transistors in the writing circuitry, the prior art developed "split-voltage" approaches to writing in which a positive voltage was applied to one node of the cells to be written to, while another voltage of the opposing polarity was applied to another node of the cells to be written. Such an approach is disclosed in Y. Miyawaki et al, "A new Erasing and Row Decoding Scheme for Low Supply Voltage Opeation 16 Mb/64 Mb flash EEPROMs", Symp. on VLSI Circuits Digest of Technical Papers, pp. 85–6 (1991), Shinichi Kobayashi, et al, "A 3.3 V-Only 16 Mb DINOR Flash Memory", ISSCC Digest of Technical Papers, pp. 122–3 (1995), Masao Kuriyama, "A 5V-Only 0.6 µm Flash EEPROM with Row Decoder Scheme in Triple-Well Structure", ISSCC Digest of Technical Papers, pp. 152–3 (1992).

While these methods have resulted in the reduction in voltage stress across the individual transistors, two charge pumps, one for positive and one for negative voltages, are typically required. Furthermore, more complex decoder circuitry are also required that occupies a greater area.

FIG. 1 shows a simplified schematic drawing of an embodiment of typical, prior art row circuitry 100. The NAND circuit 10 receives m addresses and their complements and is configured to operate as a decoder. The output 12 of the NAND decoder 10 of a selected row is raised to $V_{DD}$, while the outputs of the decoders of the unselected rows is lowered to ground. An n-channel transistor 20 has a gate biased at $V_{DD}$ for allowing the signal from the NAND decoder 10 to pass to a row line 22. Transistors 34 and 36 form an inverter.

In operation, if the output 12 of the NAND decoder 10 is low, transistor 36 is non-conducting and transistor 34 is conducting, pulling node 38 high. This will tend to turn off transistor 30, allowing the row line 22 to be biased at ground. If the output 12 of the NAND decoder 10 is high, transistor 36 will be biased into conduction while the channel conductance of transistor 34 will be reduced so that node 38 will be pulled toward ground. As the voltage on node 38 is reduced, the conductance of transistor 30 is increased which pulls the row line up to the source potential of transistors 30 and 34. This bias blocks conduction through transistor 34 and ultimately pulls row line 22 to the potential of node 40.

In the read mode, the circuit simply operates as described above with node 40 equal to $V_{DD}$. In the write mode, node 40 is biased at $V_{DD}$ until the latch consisting of transistors 30, 34, and 36 is set to a known state by the output of the NAND, with the inverter consisting of 34 and 36 in a non-conducting state. After the latch is set, bias on node 40 is gradually increased to a high voltage level, $V_{PP}$. If the NAND output 12 is low, the row line 22 is actively held low by this circuit. The potential of node 38 follows that of node 40 because of the conduction through transistor 34, which keeps transistor 30 in the non-conducting state. If the NAND output 12 is high, transistor 30 is conducting which maintains the row line at the potential of node 40 so that transistor 34 remains in a nonconducting state. In this case, the gate and source of transistor 20 are both biased at $V_{DD}$ so that this transistor is nonconducting as the row line is pulled to $V_{PP}$. When word line 22 goes to $V_{PP}$, transistor 20 acts as an isolation or blocking device for the low voltage NAND decoder. This allows the NAND decoder to be formed of high performance, low voltage transistors.

A disadvantage of the prior art circuit shown in FIG. 1 is that at least one of the transistors in the latch has the full $V_{PP}$ voltage between source and drain and at least one of these transistors has $V_{PP}$ applied between gate and channel. As is appreciated by those of ordinary skill in the art, this voltage stresses the transistors of the latch.

SUMMARY OF THE INVENTION

The present disclosure provides circuitry for supplying pulses to the memory array for the purpose of writing data to the memory. The circuitry allows operation with one of the high or low level of the pulses set to an arbitrary level that is between the minimum and maximum voltage levels, thus reducing the maximum voltage handling required of the transistors of the circuitry. The disclosed circuitry provides this capability while retaining a low transistor count that allows the circuit to occupy a small area such that it can be readily interfaced to a memory array.

Various aspects of a line driver circuit are disclosed. In one aspect, the line driver circuit may comprise a first supply voltage potential node; a second supply voltage potential node; a latch node; a first transistor of a first conductivity type and having a source coupled to the first supply voltage potential node, a drain coupled to the latch node, and a gate; a second transistor of the first conductivity type and having a source coupled to the first supply voltage potential node, a drain coupled to the gate of the first transistor of the first conductivity type, and a gate coupled to the latch node; a first transistor of a second conductivity type opposite to the first conductivity type and having a drain coupled to the drain of the first transistor of the first conductivity type, a source coupled to the second supply voltage potential node and a gate coupled to the drain of the second transistor of the first conductivity type; and a diode having an anode coupled to the second supply voltage and a cathode coupled to the row line voltage potential node. The diode of the disclosed line driver circuits may include a diode connected transistor, an isolated pn diode formed in a triple-well CMOS process, or a pin diode formed in polysilicon deposited on an insulating film.

BRIEF DESCRIPTION OF THE DRAWING FIGURES

The features, objects, and advantages of the present invention will become more apparent from the detailed description set forth below when taken in conjunction with the drawings in which like reference characters identify correspondingly throughout and wherein.

DETAILED DESCRIPTION

Persons of ordinary skill in the art will realize that the following description is illustrative only and not in any way limiting. Other modifications and improvements of the invention will readily suggest themselves to such skilled persons having the benefit of this disclosure.

Figure 2:
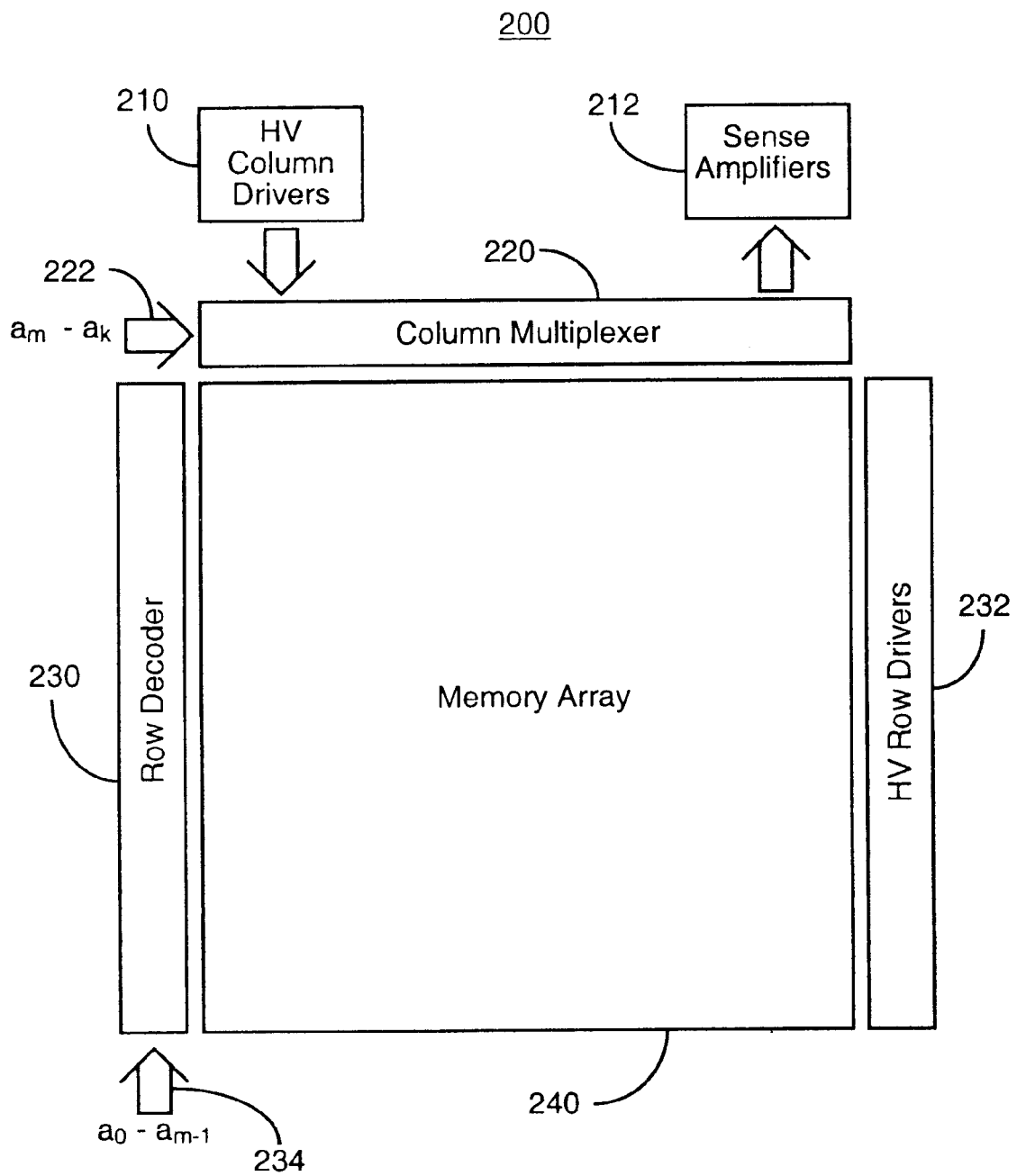
FIG. 2 is a block diagram of a typical nonvolatile memory.

A block diagram 200 of a portion of a typical nonvolatile memory is shown in FIG. 2. A typical nonvolatile memory has at its core an array 240 of memory cells arranged along rows and columns to form a rectangular grid. There are typically $2^m$ rows and $2^{(n-m)}$ columns to form a memory of $2^n$ cells. The memory is typically organized as $2^k$ words of $2^P$ bits each. Thus, (k+p)=n.

Typically, a single address selects one of $2^m$ rows and p of (n-m) columns, and low voltage biases are applied during the read operation and higher voltages during the write operations. In the block diagram, m addresses 234 are applied to the row decoders 230. The high voltage row drivers 232 are shown on the opposite ends of the row lines from the row decoders. This arrangement is not necessary; the high voltage drivers may be on the same side of the array as the row decoders. However, separation of high and low voltage circuits is commonly employed because it is often desirable to drive the row lines quickly during read to provide short read access time. It is easier to quickly drive the word lines with low voltage transistors than with high voltage transistors because the low voltage transistors have higher gain.

The column multiplexers 220 select the columns to be operated in response to the addresses ($a_m$ through $a_k$) 222. If the memory is in the read mode, the selected columns are connected to the sense amplifiers to detect the data stored in the selected memory cells. If the memory is in the write mode, the selected columns are connected to the high voltage column drivers 210 so that data supplied to the memory can be written into the selected cells.

In the discussion that follows, the focus will be on the row circuitry, but it is obvious to one of ordinary skill in the art that the invention can be applied to high voltage column circuits as well.

Figure 3A:
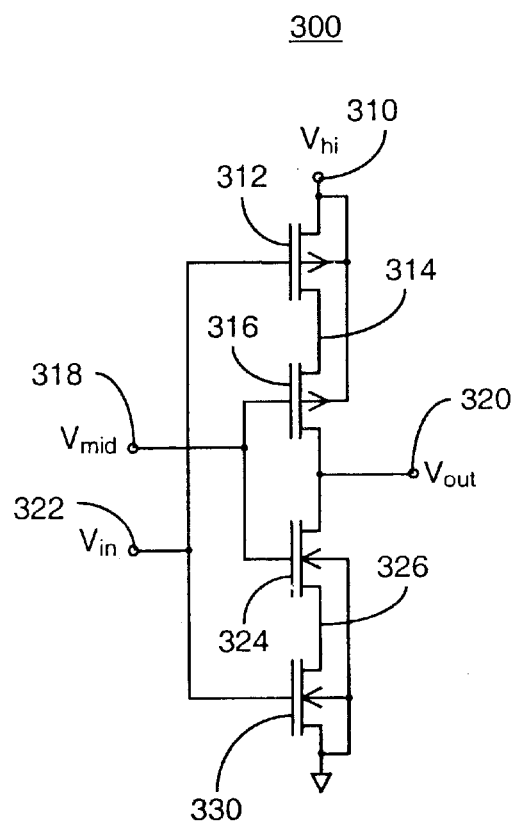
FIGS. 3A and 3B are schematic drawings of a cascode circuit and a cascode high-voltage memory programming driver circuit, respectively.

It is well known to those of ordinary skill in the art that the voltage difference between drain and source of a transistor can be reduced by a cascode circuit. In FIG. 3A, a cascode inverter 300 is shown. To understand the operation, assume that the bias applied to node 310, $V_{hi}$, is 15 V and that the bias applied to node 318, $V_{mid}$, is 5 V. If the voltage applied to node 322, $V_{in}$, is 0, transistor 330 is non-conducting and transistor 312 is turned on very hard. The bias applied to the gate of transistor 324 is such that it will conduct until its source charges to $(V_{mid}-V_{tn})$. The bias on the gate of transistor 316 will cause it to conduct so that the voltage on the node 320, $V_{out}$, is 15 V. Thus transistor 330 has $(V_{mid}-V_{tn})$ applied between drain and source and transistor 326 has $(V_{hi}-V_{mid}+V_{tn})$ applied between source and drain. Since the 1 nA threshold for conduction for transistors designed to support voltages of the magnitude 10 V is about 0.5 V, transistors 324 and 330 experience drain to source voltages of about 10.5 V and 4.5 V, respectively. Similar reasoning shows that if $V_{in}$ is 15 V, then $V_{out}$ is 0 and the voltages between the drains and sources of transistors 312 and 316 are about 5.5 V and about 10.5 V, respectively.

Figure 1:
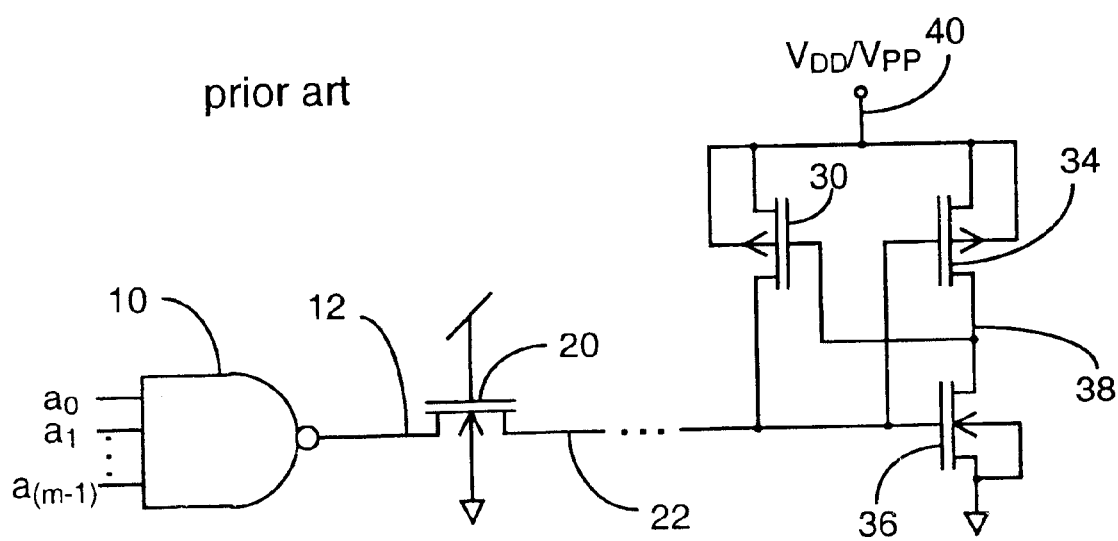
FIG. 1 is an electrical schematic drawing of a prior art circuit commonly used in nonvolatile memories.
Figure 3B:
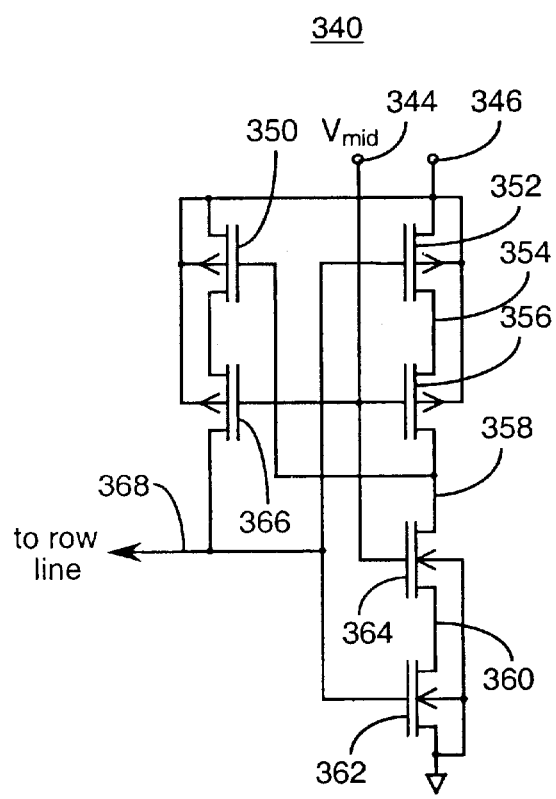

The cascode techniques discussed with respect to the inverter 300 can be applied to the three transistor half latch shown in FIG. 1. The resulting circuit 340 is shown in FIG. 3B. There are at least two disadvantages to this approach. A major disadvantage is that the number of transistors in the circuit has grown from three (30, 34, and 36) in the latch of FIG. 1, to six (350, 352, 356, 362, 364, and 366) in the latch of FIG. 3B. Since there is one latch circuit for each row, the area penalty for employing this circuit is significant. This is exacerbated by the necessity of laying out the high-voltage latches "on pitch" so that they fit together with the cells of the array.

Another disadvantage of the approach of FIG. 3B is that while it reduces the voltage difference between the drain and source of the transistors, it does not reduce the voltage difference between the gate and channel potentials.

Figure 4:
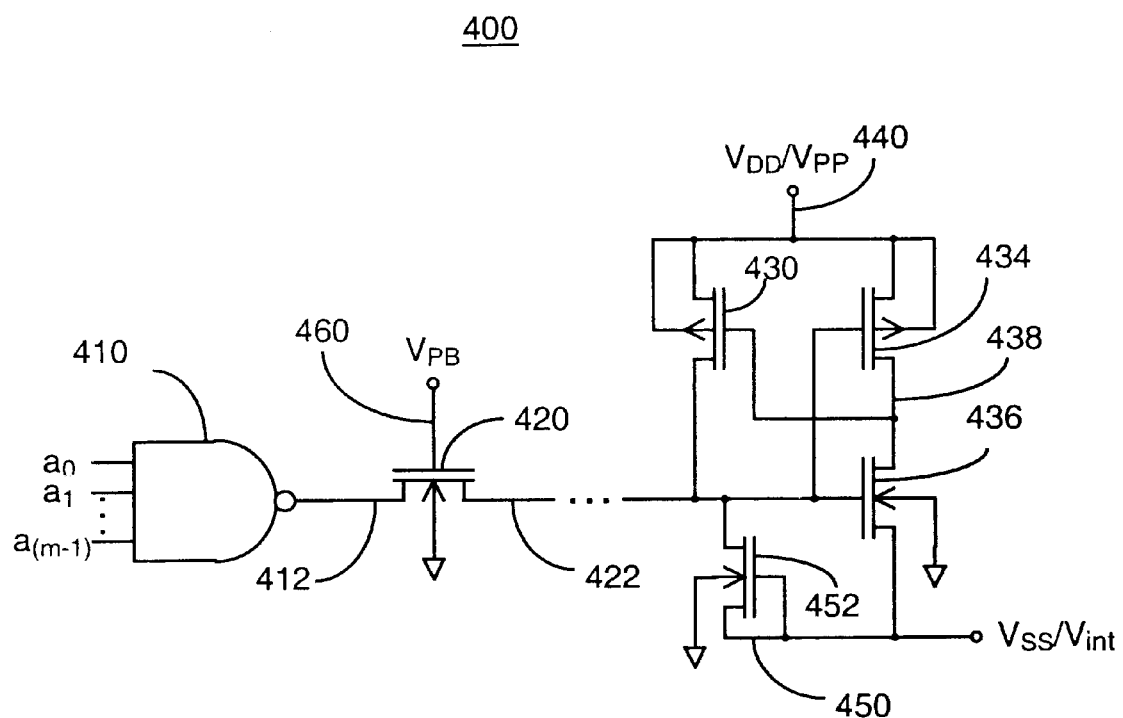
FIG. 4 is an electrical schematic drawing of an illustrative driver circuit according to the present invention.

In FIG. 4 a schematic diagram of an illustrative circuit 400 according to the present invention is shown. The circuit 400 reduces both the source-drain and gate-channel potentials at the cost of adding only one transistor 452 to the latch of FIG. 1. The other circuit elements in FIG. 4 are substantially similar to those in the circuit of FIG. 1.

Figure 5:
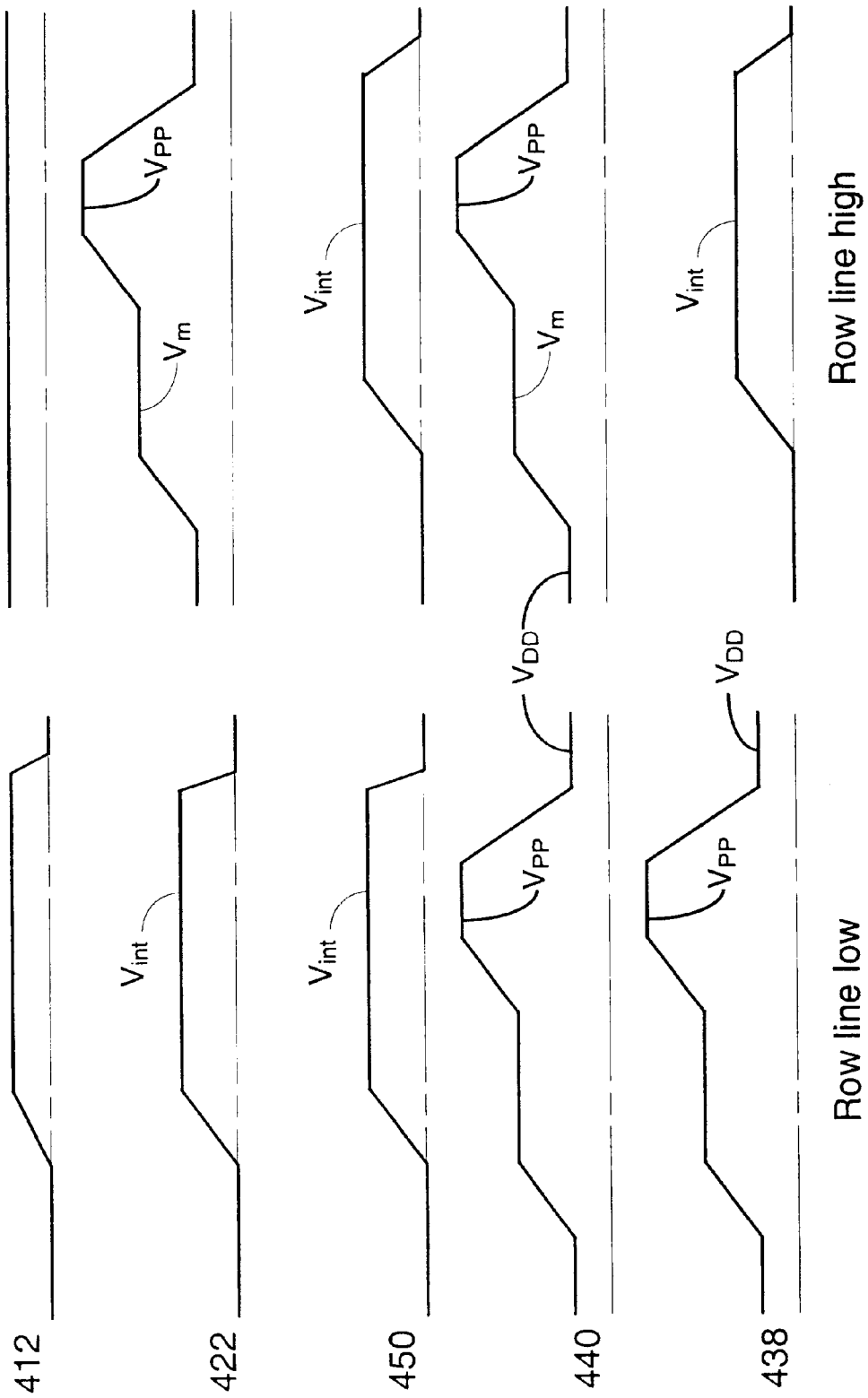
FIG. 5 is a drawing of the waveforms seen in the operation of circuits configured in accordance with the teachings of this disclosure.

The operation of circuit 400 may be explained with the help of the waveforms sketched in FIG. 5. On the left of FIG. 5 are sketches of some of the waveforms shown along a common time axis for the case wherein the row line is to be low. The sketches on the right illustrate the case wherein the row line is to be high, also shown along a common time axis.

All cases start with node 440 biased at $V_{DD}$ and node 450 biased at 0 V. In this exemplary disclosed circuit, it is assumed that $V_{DD}$=2.5 V although it will be appreciated that $V_{DD}$ is technology and application dependent. If the output node 412 of the NAND decoder 410 is 0, the row line 422 is set at 0 and the output node 438 of the inverter in the half-latch is $V_{DD}$. Node 440 is first ramped to a moderately high voltage, e.g. 8 V. The inverter output at node 438 follows the bias on node 440. Once node 438 reaches a moderate voltage, $V_m$, e.g. about 8 V, the bias of the source of transistor 436 at node 450 can be increased to an intermediate voltage $V_{int}$, e.g. 5 V, without disturbing the state of the latch. Since it is desired to also increase the voltage on the row line in order to reduce the drain-source voltage difference on transistor 430, a diode-connected transistor 452 is provided between nodes 450 and 422. As the bias on node 450 is increased, the voltage on node 422 increases and assumes the value ($V_{int}-V_{tn}$), where $V_{tn}$ is the threshold voltage of the n-channel transistor 452 because of the current flowing through the diode.

Although the circuit diagram of FIG. 4 shows component 452 to be a diode connected MOSFET, it will be clear to one of ordinary skill in the art that there are other means of providing the diode function which may be suitable for use in the present disclosure. For example, an isolated pn diode formed in a triple well CMOS process could be used, as could a pin diode formed in polysilicon deposited on an insulating film.

Consider the isolation transistor 420 and the output node 412 of the NAND decoder 410 connected to it. If the potential of node 412 were to remain at ground and the transistor 420 were to remain in a conducting state as the voltage level of 422 is increased by current flowing through device 452, current flowing through transistor 420 would tend to clamp the node 422. One solution is to pulse the gate of transistor 420 to ground when the bias on node 450 begins to increase from ground, thus blocking current flow through 420. In this embodiment, the solution chosen is to place the output transistors of the NAND decoder 410 into a high impedance state as the bias on node 450 begins to increase. With this solution, the potential on the node 412 increases until it reaches the bias on the gate of transistor 420, $V_{PB}$, minus its threshold. An advantage of this solution is that the bias between the gate and drain of transistor 420 is reduced by $V_{PB}$. $V_{PB}$ can be $V_{DD}$ or $V_{PB}$ can be a threshold drop below $V_{DD}$ in this mode of operation depending on the minimum value of $V_{DD}$ and the value of $V_t$.

Once the voltage on the node 450 has increased to $V_{int}$, the bias on node 440 is increased from $V_m$ to the maximum value of $V_{PP}$. The gate-to-source capacitance of transistor 434 will attempt to couple node 422 upwards, but this effect will be countered by the much larger capacitance of the row line. Since the diode 452 drives node 422 to a potential that is a $V_{th}$ below the source potential of transistor 436, this transistor remains nonconducting and node 438 is held at the potential of node 440 by the conduction through transistor 434. This assures that transistor 430 doesn't conduct.

If the output of the NAND decoder is initially at $V_{DD}$, as is shown in the waveforms sketched on the right side of FIG. 5, transistor 436 is conducting and wordline 422 is pulled to $V_{DD}$ by conduction through transistor 430. As node 440 is pumped to the moderately high voltage $V_m$, the conduction through transistor 436 holds node 438 at ground so that transistor 430 remains conducting and the row line is pulled to the potential $V_m$ of node 440. When the bias on node 450 is increased to $V_{int}$, the diode does not conduct because $V_{int}$ is chosen to be less than the intermediate high voltage, $V_m$. On the other hand, because transistor 436 is conducting, the potential on node 438 is increased to $V_{int}$. The node 440 can then be ramped to the maximum level of $V_{PP}$ with the assurance that the voltage stresses across the transistors of the latch are reduced to no more than $V_{PP}-V_{int}$.

Although the operation of the circuit has been described with a particular sequence of applying biases for clarity of exposition, it will be clear to one of ordinary skill in the art that other sequences could be used with equal success depending on factors such as the drive capacity of the source of the high voltage $V_{PP}$ pulse and timing considerations. For example, the nodes 440 and 450 could be ramped up in voltage at the same time as long as the rate of increase of voltage on the two nodes is proportional to their relative voltage swings.

In the example, certain values have been given for the magnitude of the various voltage levels applied for the sake of clarity, but this invention is not limited to the levels cited. The value of $V_{int}$ may be chosen to have a value in the range of 20–50% of the maximum value of $V_{PP}$. The intermediate levels of $V_{PP}$ may be chosen such that the latch remains solidly set in its initial state throughout the application of the pulse. In one aspect, a good guideline is that $V_{PP} \geq (V_{int}+V_{DD})$.

The previous disclosure is provided to enable any person skilled in the art to make or use the present invention. The various modifications will be readily apparent to those skilled in the art, and the generic principles defined herein may be applied to other embodiments without the use of the inventive faculty. Thus, the present disclosure is not intended to be limited to the embodiments shown herein but is to be accorded the widest scope consistent with the principles and novel features disclosed herein.

What is claimed is:

1. A row line driver circuit coupled to a row line comprising:
   a first supply voltage potential node;
   a second supply voltage potential node;
   a latch node;
   a first transistor of a first conductivity type and having a source coupled to said first supply voltage potential node, a drain coupled to said latch node, and a gate coupled to the row line;
   a second transistor of said first conductivity type and having a source coupled to said first supply voltage potential node, a drain coupled to said row line, and a gate coupled to said latch node;
   a first transistor of a second conductivity type opposite to said first conductivity type and having a drain coupled to said latch node, a source coupled to said second supply voltage potential node and a gate coupled to said row line; and
   a diode having a cathode coupled to said row line and an anode coupled to said second supply voltage potential node.

2. The row line driver circuit of claim 1, wherein said diode comprises a second transistor of said second conductivity type having a drain coupled to said row line, and a gate and a source both coupled to said second supply voltage potential node.

3. The row line driver circuit of claim 1, wherein said diode comprises an isolated pn diode formed in a triple-well CMOS process.

4. The row line driver circuit of claim 1, wherein said diode comprises a pin diode formed in polysilicon deposited on an insulating film.

5. The row line driver circuit of claim 1, wherein said transistors of said first type comprise p-channel transistors and said transistor of said second type comprises an n-channel transistor.

6. The row line driver circuit of claim 1, wherein said row line is coupled to a decoder through an isolation transistor.

7. The row line driver circuit of claim 1, wherein said isolation transistor is of said second conductivity type.

8. The row line driver circuit of claim 1, wherein said diode comprises an isolated diode formed in silicon-on-insulator technology.

9. A row line driver circuit coupled to a row line comprising:
- a first supply voltage potential node;
- a second supply voltage potential node;
- a latch node;
- a first p-channel MOS transistor having a source coupled to said first supply voltage potential node, a drain coupled to said latch node, and a gate coupled to the row line;
- a second p-channel MOS transistor having a source coupled to said first supply voltage potential node, a drain coupled to said row line, and a gate coupled to said latch node;
- a first n-channel MOS transistor having a drain coupled to said latch node, a source coupled to said second supply voltage potential node and a gate coupled to said row line; and
- a diode having a cathode coupled to said row line and an anode coupled to said second supply voltage potential node.

10. The row line driver circuit of claim 9, wherein said diode comprises a second n-channel transistor having a drain coupled to said row line, and a gate and a source both coupled to said second supply voltage potential node.

11. The row line driver circuit of claim 9, wherein said diode comprises an isolated pn diode formed in a triple-well CMOS process.

12. The row line driver circuit of claim 9, wherein said diode comprises a pin diode formed in polysilicon deposited on an insulating film.

13. The row line driver circuit of claim 9, wherein said row line is coupled to a decoder through an isolation transistor.

14. The row line driver circuit of claim 9 further comprising:
- an n-channel isolation transistor between said row line and a low voltage decoder.

* * * * *